US 6,673,997 B2

(12) United States Patent
Blieske et al.

(10) Patent No.: US 6,673,997 B2
(45) Date of Patent: Jan. 6, 2004

(54) SOLAR MODULE WITH BORDER SEALING

(75) Inventors: Ulf Blieske, Monchengladbach (DE); Nikolas Janke, Herzogenrath (DE); Hubert Hauser, Wuerselen (DE)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 10/050,609

(22) Filed: Jan. 18, 2002

(65) Prior Publication Data

US 2003/0062079 A1 Apr. 3, 2003

Related U.S. Application Data

(63) Continuation of application No. 09/840,131, filed on Apr. 24, 2001.

(30) Foreign Application Priority Data

Oct. 22, 1999 (DE) .......................................... 199 20 893

(51) Int. Cl.[7] .............................................. H01L 31/048
(52) U.S. Cl. ........................ 136/251; 136/244; 257/433; 257/434
(58) Field of Search ................................ 136/251, 244; 257/433, 434

(56) References Cited

U.S. PATENT DOCUMENTS

| | | | | | |
|---|---|---|---|---|---|
| 4,847,669 A | * | 7/1989 | Yamazaki et al. | .......... | 136/251 |
| 5,022,930 A | * | 6/1991 | Ackerman et al. | .......... | 136/251 |
| 5,213,627 A | * | 5/1993 | Marquardt et al. | ......... | 136/251 |
| 5,217,540 A | * | 6/1993 | Ogura | ........................ | 136/251 |
| 5,478,402 A | * | 12/1995 | Hanoka | ....................... | 136/251 |
| 5,667,595 A | * | 9/1997 | Vaverka et al. | ............. | 136/251 |
| 5,980,666 A | * | 11/1999 | Roth et al. | ................... | 156/107 |
| 6,420,646 B2 | * | 7/2002 | Benz et al. | ................. | 136/251 |
| 6,462,266 B1 | * | 10/2002 | Kurth | ......................... | 136/251 |

FOREIGN PATENT DOCUMENTS

| | | | |
|---|---|---|---|
| EP | 896371 A1 | * | 2/1999 |
| EP | 1094528 A2 | * | 4/2001 |
| JP | 11-340494 A | * | 12/1999 |

* cited by examiner

*Primary Examiner*—Alan Diamond
(74) *Attorney, Agent, or Firm*—Oblon, Spivak, McClelland, Maier & Neustadt, P.C.

(57) ABSTRACT

A solar module containing thin-film solar cells positioned between two plates separated by a border seal at the external edge of the plates. The border seal includes an elastomeric spacer that contains a moisture-absorbing medium and is coated with an external peripheral adhesive bead.

14 Claims, No Drawings

SOLAR MODULE WITH BORDER SEALING

This application is a Continuation application of U.S. application Ser. No. 09/840,131 filed on Apr. 24, 2001.

The invention relates to a solar module with border sealing having the characteristics of the preamble of claim 1.

Document DE 195 14 908 C1 discloses a process for manufacturing a solar module, in which a polyether-polyurethane is used as a casting substance for sealing a thin-film solar cells embedded between two glass panes.

Once the solar cells have been fixed to a support plate, the electrical connections between the individual solar cells (series circuit) are made and the leads grouped in rows are brought to the outside at predetermined places over the edge of the glass support plate. An adhesive bead is then deposited, for example by extrusion, along the edge of the pane, which bead serves, on the one hand, to seal the border of the solar modular and, on the other hand, to act as a spacer between the two glass plates. Nothing is mentioned about the composition of the adhesive bead, apart from its ability to be extruded, nor is anything mentioned about the type of construction of the solar cells.

Introduced into two diagonally opposed corner regions of the adhesive bead are lengths of tubing which serve for the subsequent filling and venting of the hollow space between the two glass panes. Next, the front glass pane is applied and then the two glass panes are compressed, one against the other, until the desired spacing is achieved.

Next, the hollow space between the two glass panes is filled with the casting resin compound, the solar module preferably being oriented in a roughly vertical position and the casting resin substance filling the space via a lower tube, while the upper tube serves for venting. After filling, the two tubes are removed and the orifices are sealed using an adhesive.

The solar module thus filled without any bubbles forming is then put into an autoclave. The temperature of the autoclave is about 40° C. and the overpressure in the autoclave is set to about 0.6 bar. Under these conditions, the casting resin cures and, after 60 minutes, reaches the completely cured state. After removing the solar module from the autoclave, it is ready to be used. In practice when manufacturing such a solar module, it is also possible to dispense with the overpressure.

A widely-practised method of constructing solar cells is to use a layer of absorbent containing, as constituents, copper, indium and selenium, and sometimes also sulphur instead of selenium (this is known as a CIS absorbent layer). It is also possible to add gallium to the absorbent layer (hence a CIGS absorbent layer). In general, and hereafter, these layers will be called chalcopyrite absorbent layers. It is known that their photovoltaic yield is appreciably reduced by the penetration of moisture, or alternatively the penetration of water molecules by diffusion, even without a visible deterioration in the optical appearance.

In the case of the above solar modules, of the type mentioned at the start, having a chalcopyrite absorbent layer, an acrylic tape (commercially available with the name 3M Isotac 4918) is used as a border seal. It turns out that the solar cells provided with this seal, after undergoing the damp-heat test according to the IEC 61215 standard (IEC= International Energy Commission), were admittedly impeccable from the optical standpoint, but their yield had dropped by more than 20% as a result of water molecules defusing into the chalcopyrite absorbent layer. However, according to the IEC 1646 standard, only a reduction of 5% is allowed.

The damp-heat test mentioned essentially consists of storing the solar modules for more than 1000 hours at a temperature of 85° C. and a relative humidity of 85%. It turns out that penetration of water molecules by diffusion rapidly increases with the duration of use.

In this context it is known (Document DE 197 33 913 A1), for the purpose of producing an environmentally resistant encapsulation of thin-film structural elements, for example solar modules with a chalcopyrite absorbent layer, to fill a hollow space formed between a frame and the border of the structural element using a drying agent for the purpose of absorbing moisture. This is in fact to avoid turbidity brought about by the moisture in the laminated adhesive used and corrosion of the bands of solder conducting the current for external electrical contacting of the modules.

According to document DE 195 03 510 C2, it is possible to seal around the border of the composite glass panes which are provided with a heat-reflecting coating, which is embedded in the composite, by not extending the coating as far as the external edge and by sealing the peripheral slot around the border between the two glass panes using a polymer introduced by spraying, which polymer may be combined, by melting, with the polymer of which the composite is formed.

It is also known (from document DE 41 31 393 C2) to provide the internal faces of the individual panes with an isolating pane made of conventional solar cell glass, the electrical connections of which are taken beyond the border composite out of the gas-tight sealed internal space. The border composite is composed there of a spacer, its bonding to the glass panes and of a seal of a conventional kind placed on the outside. This publication also describes solar cells embedded in a casting resin, which are also protected by a border seal against the effects of the external environment. However, the composition of this seal is not specified further.

In order to seal the disk-shaped intermediate spaces of the glass isolating panes, it is known to introduce a drying agent such as a moisture absorbent into the spacer, which may be manufactured from an adhesively bonded metal section or from a bead of elastomer. The drying agent is also called a molecular sieve.

If the spacer is only made from an elastomer ("thermoplastic spacer" or TPS for short), the drying agent is mixed with the synthetic material before application (for example before extrusion) to the edge of the glass pane. A commercial compound (the product Naftotherm® BU-TPS from Chemetall GmbH) for a thermoplastic spacer is composed of polyisobutylene as base and of zeolite powder as drying agent. This material with a component, containing no solvents, can be extruded in the range of about 140 to 160° C. and adheres well to glass.

The basic objective of the invention is to indicate a further improved seal for a thin-film structural element with a chalcopyrite absorbent layer.

This objective is achieved according to the invention by means of the characteristics of claim 1. The characteristics of the secondary claims indicate advantageous improvements to this article.

First, starting from a solar module according to document DE 195 14 908 C1, the spacer is thus combined with a molecular sieve, so as in this way to fix any moisture which might penetrate into the border region. The border slot is filled in turn, all around the perimeter, with an adhesive, for example a polysulphide, which constitutes an additional moisture barrier. The thermoplastic spacer is furthermore mechanically stress relieved by this additional adhesive, so that the module is also stronger from the mechanical standpoint.

It may be advantageous to apply, around the border, an adhesion promoter to the surfaces of the plates which enclose the solar module, so as to improve the adhesion between the polymer spacer and the adhesive, on one side, and the glass, on the other side.

Effective protection of the bonding or sealing material around the border of the solar modules against ageing and a tendency to embrittle due to the action of the UV part of sunlight can be achieved by providing an opaque colour layer which is applied around the border at the very least on the plate facing, at the construction stage, the solar radiation. Border colour layers of this kind, which can be manufactured for example by screen printing and subsequent baking, are in general use in the case of motor-vehicle windows.

When electrical connections have to be taken to the outside over the edge of one of the plates, they are thus formed, according to an appropriate embodiment, at the very least in the border sealing region, by copper strips which are linked, via a mechanical contact in the form of a sheet, on the one hand, with the plate, for example by adhesive bonding or by brazing with a braze suitable for metal-to-glass bonding, and which are covered, on the other hand, by the border seal. In this way, the manufacture of the border seal by extrusion is only disturbed minimally at the corresponding penetration leads, while still, despite everything, ensuring good sealing at these points.

However, there is a particularly simple way of making the border seal by extrusion when the electrical connections of the solar cells are taken to the outside not over the edge of one of the plates, but through a hole in a plate surface and when they must consequently not be taken into account especially during extrusion of the border seal. This hole can be reliably plugged up, after the connections have been passed through it, using a suitable sealant.

In a preferred embodiment of a solar module according to the invention, the thin-film solar cells are produced in a manner known per se directly on one of the plates (of glass) of the module. A metal base electrode, for example made of molybdenum (Mo), is firstly applied. Next, a chalcopyrite absorbent layer is made on the base electrode. Finally, a transparent front electrode, for example made of zinc oxide (ZnO), is applied to the absorbent layer. The base electrode and the front electrode may preferably be deposited by magnetic-field-enhanced sputtering. Where appropriate, it is necessary to provide, in a known manner, a buffer layer between the chalcopyrite absorbent layer and the front electrode.

A multiplicity of solar cells, series-connected from the electrical standpoint, is manufactured in a known manner by subdivision ("structuring") of the multilayer over its entire area and of the appropriate conducting connections. The two external electrical connections are taken to the outside over the edge of the plates; they are made, at the very least in the region of the border seal yet to be produced, preferably in the form of flat copper strips which are linked to the subjacent plate, in the form of a sheet by adhesive bonding or soldering. A cross section with a relatively high conductivity is needed to be able to reliably discharge the complete electrical power of the solar cells. This is why leads produced by screen-printing of conductive pastes cannot be used for this application.

In a variant, the external electrical connections of the solar module are taken to the outside through a hole in the surface of the plates. Thus, any disturbance to the border seal caused by passage of the leads is avoided.

Now, by analogy with the manner of implementation disclosed at the beginning in document DE 195 14 908 C1, a spacer made of a thermoplastic material mixed with a drying agent, preferably made from the above-mentioned product, is applied along the edge of the plate, but with, however, a small shift towards the inside. Placed over the plate is the second transparent plate of the module and the two plates are compressed to the desired separating distance. The remaining border slot is then filled with the adhesive bead, providing an additional sealing action towards the outside.

However, by using suitable tools, it is possible to produce the spacer and the adhesive bead by coextrusion in a manner different from the aforementioned method, that is to say, in one work step, the two beads are deposited one beside the other on the plate provided with solar cells, before the second plate is applied.

Of course, at least one orifice must be provided for injecting the transparent casting substance, which is yet to be used for filling, and at least one venting orifice.

After filling with the transparent filling substance, the filling and venting orifices must be plugged up. The filling substance can be cured or solidified, where appropriate, also in a known manner, in an autoclave by the action of heat and, if necessary, by applying pressure.

After this treatment, the solar module is ready for use. Thanks to the cured filling substance, the two plates are very firmly bonded together in the form of a sheet, in a manner similar to a composite glass pane; the double border sealing according to the invention furthermore guarantees that, even in the case of prolonged use outdoors of solar modules of this kind, under changing environmental conditions, no breakdown whatsoever as a result of moisture penetration would be expected.

What is claimed is:

1. A solar module comprising one or more thin-film solar cells present between two plates separated by a border seal present around the external edge of the plates,
   wherein one or more electrical connections of the solar cells extend outside an enclosed space of the solar module, and
   wherein the border seal comprises an elastomeric spacer comprising a moisture-absorbing medium, and an external peripheral adhesive bead.

2. The solar module according to claim 1, wherein the spacer comprises a thermoplastic elastomer mixed with a moisture-absorbing medium.

3. The solar module according to claim 1, wherein the plates are coated with an adhesion promoter in a region of contact with the spacer and the adhesive bead.

4. The solar module according to claim 1, wherein at least one plate is covered at a region contacting the border seal with an opaque layer.

5. The solar module according to claim 1, wherein the electrical connections are present in the border sealing region and comprise copper strips which are connected to one of the plates via a mechanical contact in the form of a sheet and further wherein the electrical connections are covered with the border seal.

6. The solar module according to claim 1, wherein the electrical connections extend outside one of the plates via a hole which is plugged with a sealant.

7. The solar module according to claim 1, wherein the spacer and the adhesive bead are deposited one beside the other by coextrusion.

8. The solar module according to claim 1, wherein the plates are glass plates.

9. The solar module according to claim 1, wherein the thin-film solar cells are sealed between the plates with a casting substance.

10. The solar module according to claim 1, wherein the thin-film solar cells comprise a chalcopyrite layer.

11. The solar module according to claim 5, wherein the mechanical contact between the electrical connections and the plate is by adhesive bonding.

12. The solar module according to claim 1, wherein the moisture-absorbing medium is a molecular sieve.

13. The solar module according to claim 1, wherein the elastomeric spacer comprises polyisobutylene and a zeolite powder.

14. The solar module according to claim 1, wherein the adhesive bead comprises a polysulphide.

* * * * *

UNITED STATES PATENT AND TRADEMARK OFFICE
CERTIFICATE OF CORRECTION

PATENT NO. : 6,673,997 B2
DATED : January 6, 2004
INVENTOR(S) : Blieske et al.

It is certified that error appears in the above-identified patent and that said Letters Patent is hereby corrected as shown below:

<u>Title page,</u>
Item [75], Inventors, should read:
-- [75]  Inventors: Ulf Blieske, Moenchengladbach (DE);
                    Nikolas Janke, Herzogenrath (DE);
                    Hubert Hauser, Wuerselen (DE) --

Item [30], should read:
-- [30]          Foreign Application Priority Data
    Oct. 22, 1999  (DE) ........................... 199 50 893 --

Signed and Sealed this

Sixth Day of April, 2004

JON W. DUDAS
*Acting Director of the United States Patent and Trademark Office*